(12) United States Patent
Wakako et al.

(10) Patent No.: US 6,472,609 B2
(45) Date of Patent: Oct. 29, 2002

(54) PRINTED-WIRING SUBSTRATE AND METHOD FOR FABRICATING THE PRINTED-WIRING SUBSTRATE

(75) Inventors: Hisashi Wakako; Masahiro Iba; Kazuhisa Sato; Kazuo Kimura, all of Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/866,999

(22) Filed: May 25, 2001

(65) Prior Publication Data

US 2001/0047881 A1 Dec. 6, 2001

(30) Foreign Application Priority Data

May 26, 2000 (JP) ........................................ 2000-156050

(51) Int. Cl.[7] .................................................. H05K 1/03
(52) U.S. Cl. ........................ 174/255; 174/261; 361/760
(58) Field of Search ................................. 174/255, 261, 174/256; 361/751, 760, 767, 768

(56) References Cited

U.S. PATENT DOCUMENTS

| | | | | |
|---|---|---|---|---|
| 6,052,287 A | * | 4/2000 | Palmer et al. ............... | 361/767 |
| 6,225,569 B1 | * | 5/2001 | Hashimoto et al. ......... | 174/260 |
| 6,284,353 B1 | * | 9/2001 | Takada et al. ............... | 428/209 |
| 6,303,878 B1 | * | 10/2001 | Kondo et al. ................ | 174/261 |

FOREIGN PATENT DOCUMENTS

| | | | |
|---|---|---|---|
| EP | 0 654 818 | 5/1995 | .......... H01L/21/48 |
| JP | 7-193166 | 7/1995 | .......... H01L/23/12 |
| JP | 09-260536 | * 3/1997 | |
| JP | 2915888 | 4/1999 | .......... H01L/23/12 |

OTHER PUBLICATIONS

Patent Abstracts of Japan. JP 2915888. Apr. 16, 1999.
English language Abstract. JP 7193166. Jul. 28, 1995.

* cited by examiner

*Primary Examiner*—Albert W. Paladini
(74) *Attorney, Agent, or Firm*—Sughrue Mion, PLLC

(57) ABSTRACT

A printed-wiring substrate 1 has main-face-side connection terminals 33 for solder-bonding to connection terminals 83 of an IC chip 81 on a main face 1A thereof and back-face-side connection terminals 41 for connecting, through mechanical contact, to connection terminals 93 of a motherboard 91 on a back face 1B thereof. The surface of each of the main-face-side connection terminals 33 is covered with a main-face-side displacement Au plating layer 45 having a thickness of 0.03 to 0.12 μm, and the surface of each of the back-face-side connection terminals 41 is covered with a back-face-side displacement Au plating layer 55, which is thicker than the main-face-side displacement Au plating layer 45 and has a thickness of 0.2 μm or greater.

3 Claims, 12 Drawing Sheets

PRINTED-WIRING SUBSTRATE AND METHOD FOR FABRICATING THE PRINTED-WIRING SUBSTRATE

BACKGROUND OF THE INVENTION

1. Field of the Invention

The present invention relates to a printed-wiring substrate having connection terminals, and more particularly, to a printed-wiring substrate having connection terminals on each of main and back faces thereof.

2. Description of the Related Art

Conventionally, a printed-wiring substrate having connection terminals on each of main and back faces thereof has been known. FIG. 11 shows an example of a printed-wiring substrate 101.

The printed-wiring substrate 101 generally has a plate-like shape, and has a main face 101A and a back face 101B. A large number of main-face-side connection terminals 103 are formed on the main face 101A; and a large number of back-face-side connection terminals 105 are formed on the back face 101B. An IC chip 111 indicated by a broken line in FIG. 11 can be mounted on the main face 101A by solder-bonding connection terminals 113 of the IC chip 111 to the main-face-side connection terminals 103. Similarly, a motherboard 121, indicated by a broken line in FIG. 11, can be connected to the back face 101B by solder-bonding connection terminals 123 of the motherboard 121 to the back-face-side connection terminals 105.

To prevent oxidation, each of the main-face-side connection terminals 103 of the printed-wiring substrate 101, which are formed of copper connection pads, is covered with an Ni plating layer having a thickness of about 3 to 7 µm, and is further covered with a thin Au plating layer having a thickness of about 0.05 µm.

The reason for thinning the Au plating layer is that if the Au plating layer is thick, an inter-metallic compound is produced when the main-face-side connection terminals 103 and the connection terminals 113 of the IC chip 111 are soldered together, resulting in deteriorated solderability and connection reliability. Specifically, during the solder-bonding process, Au-Sn, which is a hard and brittle inter-metallic compound, is produced at the interface between solder and the main-face-side connection terminals 103 due to diffusion of Au contained in the Au plating layer of the main-face-side connection terminals 103 and Sn contained in solder. This reduces the bonding strength between the printed-wiring substrate 101 and the IC chip 111. Accordingly, the Au plating layer is preferably rendered as thin as possible in order to solve the problem caused by production of an inter-metallic compound, to thereby enhance connection reliability with the main-face-side connection terminals 103.

Similarly, each of the back-face-side connection terminals 105 of the printed-wiring substrate 101, which are formed of copper connection pads, is covered with an Ni plating layer having a thickness of about 3 to 7 µm, and is further covered with a thin Au plating layer having a thickness of about 0.05 µm.

A printed-wiring substrate 201 as shown in FIG. 12 has recently been developed as an improvement of the above-described printed-wiring substrate 101.

In the printed-wiring substrate 201, main-face-side connection terminals 203 are formed on the main face 201A; and back-face-side connection terminals 205 are formed on the back face 201B. An IC chip 211 can be mounted on the main face 201A by solder-bonding connection terminals 213 of the IC chip 211 to the main-face-side connection terminals 203. Similarly, a motherboard 221 can be connected to the back face 201B not by means of solder, but through use of a socket or the like which establishes mechanical contact between connection terminals 223 of the motherboard 221 and the back-face-side connection terminals 205.

3. Problems to be Solved by the Invention

When the printed-wiring substrate 201 shown in FIG. 12 is used, the back-face-side connection terminals 205 are forcedly brought into contact with the connection terminals 223 of the motherboard 221, and the contact may cause exfoliation of the Au plating layer formed on the surfaces of the back-face-side connection terminals 205. In such a case, the Ni plating layer is exposed from portions at which the Au plating layer has exfoliated. This may result in problems such as an increase in the contact resistance between the back-face-side connection terminals 205 and the connection terminals 223 of the motherboard 221.

SUMMARY OF THE INVENTION

The present invention has been achieved in view of the foregoing. It is therefore an object of the invention to provide a printed-wiring substrate capable of increasing connection reliability with an electronic component to be mounted on the main face as well as the connection reliability with another substrate to be connected to the back face of the printed-wiring substrate. Another object of the present invention is to provide a method for fabricating the printed-wiring substrate.

The above first object of the present invention has been achieved by providing a printed-wiring substrate having a substantially plate-like shape, a main face and a back face, and comprising main-face-side connection terminals for solder-bonding to connection terminals of an electronic component which is to be mounted on the main face; and back-face-side connection terminals for connecting, through mechanical contact, to connection terminals of another substrate which is to be connected to the printed-wiring substrate on the back-face side thereof, wherein the surfaces of the main-face-side connection terminals are coated with a main-face-side Au plating layer; and the surfaces of the back-face-side connection terminals are coated with a back-face-side Au plating layer which is thicker than the main-face-side Au plating layer.

In the printed-wiring substrate of the present embodiment having main-face-side connection terminals for solder-bonding to connection terminals of an electronic component and back-face-side connection terminals for connecting, through mechanical contact, to connection terminals of another substrate, the main-face-side Au plating layer is rendered relatively thin, and the back-face-side Au plating layer is rendered relatively thick.

Accordingly, only a small amount of inter-metallic compound is produced from Au of the main-face-side connection terminals and Sn contained in solder when the main-face-side connection terminals and the connection terminals of the electronic component are soldered together. Therefore, the solderability of the main-face-side connection terminals is enhanced, so that the reliability of connection between the main-face-side connection terminals and the connection terminals of the electronic component is improved. In addition, since the back-face-side Au plating layer has an increased thickness, the problem of exfoliation of the back-face-side Au plating layer with resultant exposure of a base layer and increased contact resistance does not occur even when the back-face-side connection terminals are connected to the connection terminals of another substrate through mechanical contact. Therefore, the connection reliability between the back-face-side connection terminals and the connection terminals of another substrate can be improved as well.

Moreover, in the above-described printed-wiring substrate, the main-face-side Au plating layer preferably has a thickness of not less than 0.03 μm but not greater than 0.12 μm; and the back-face-side Au plating layer preferably has a thickness of not less than 0.2 μm.

In the present embodiment, since the main-face-side Au plating layer preferably has a thickness of not less than 0.03 μm but not greater than 0.12 μm, oxidation of the main-face-side connection terminals can be reliably prevented. In addition, the amount of inter-metallic compound (e.g., Au—Sn inter-metallic compound) produced at the time of soldering the main-face-side connection terminals and the connection terminal of the electronic component can be reduced. Therefore, the solderability between the main-face-side connection terminals and the connection terminals of the electronic component can be further enhanced, and the reliability of the connection can be further improved.

Meanwhile, since the back-face-side Au plating layer has a thickness of not less than 0.2 μm, exfoliation of the back-face-side Au plating layer is prevented due to mechanical contact between the back-face-side connection terminals and the connection terminals of another substrate. Therefore, the solderability between the back-face-side connection terminals and the connection terminals of another substrate can be further enhanced, and the reliability of the connection can be further improved.

The above second object of the present invention has been achieved by providing a method for fabricating a printed-wiring substrate having a substantially plate-like shape, a main face and a back face, and comprising main-face-side connection terminals for solder-bonding to connection terminals of an electronic component which is to be mounted on the main face; and back-face-side connection terminals for connecting, through mechanical contact, to connection terminals of another substrate which is to be connected to the printed-wiring substrate on the back-face side thereof. The method comprises a first Au plating step of forming a first main-face-side Au plating layer on the surfaces of the main-face-side connection terminals and a first back-face-side Au plating layer on the surfaces of the back-face-side connection terminals; a masking step of covering the first main-face-side Au plating layer with a protection layer; a second Au plating step of forming a second back-face-side Au plating layer on the first back-face-side Au plating layer; and a protection layer removal step of removing the protection layer after completing the second Au plating step.

According to the present embodiment, after forming a first main-face-side Au plating layer and a first back-face-side Au plating layer in the first Au plating step, the first main-face-side Au plating layer is covered with a protection layer, and in the second Au plating step, a second back-face-side Au plating layer is formed on the first back-face-side Au plating layer only.

Therefore, in a printed-wiring substrate having main-face-side connection terminals for solder-bonding to connection terminals of an electronic component and back-face-side connection terminals for connecting, through mechanical contact, to connection terminals of another substrate, the Au plating layer of the main-face-side connection terminals (the first main-face-side Au plating layer) can be formed to have a relatively small thickness; and the Au plating layer of the back-face-side connection terminals (the first back-face-side Au plating layer and the second back-face-side Au plating layer) can be formed to have a relatively large thickness.

Such a printed-wiring substrate can enhance the solderability between the main-face-side connection terminals and the connection terminals of the electronic component, so that the connection reliability can be improved. In addition, the reliability of the connection between the back-face-side connection terminals and the connection terminals of another substrate can be improved.

Further, in the present embodiment, since the second back-face-side Au plating layer is formed on the first back-face-side Au plating layer immediately after the masking step, without removing the first back-face-side Au plating layer, productivity of the printed-wiring substrate can be improved.

Moreover, in the above-described method of fabricating a printed-wiring substrate, the first Au plating is preferably first displacement Au plating; and the second Au plating is preferably second displacement Au plating.

In many cases, the main-face-side connection terminals for connection with an electronic component and the back-face-side connection terminals for connection with another substrate are both formed in such a manner that individual terminals are electrically isolated from one another. Therefore, electroless Au plating is preferably used as the first Au plating and the second Au plating.

However, since reduction Au plating, which is one type of electroless Au plating, is frequently performed using a strong-alkaline plating solution containing potassium cyanoaurate, during plating, components of the protection layer may be dissolved into the plating solution, resulting in variation in plating conditions. Further, in the case in which a printed-wiring substrate formed of resin is fabricated, a solder resist layer may be damaged by the plating solution, or the plating solution may penetrate under the solder resist layer, resulting in generation of so-called harrowing.

By contrast, in the present embodiment, the first displacement Au plating and the second displacement Au plating are performed using an acidic or neutral plating solution, and thus the problem of dissolution of the protection layer with resultant variation in plating conditions and the problem of harrowing can be avoided.

The above second object of the present invention has also been achieved by providing a method for fabricating a printed-wiring substrate having a substantially plate-like shape, a main face and a back face, and comprising main-face-side connection terminals for solder-bonding to connection terminals of an electronic component which is to be mounted on the main face; and back-face-side connection terminals for connecting, through mechanical contact, to connection terminals of another substrate which is to be connected to the printed-wiring substrate on the back-face side thereof. The method comprises a first Au plating step of forming a first main-face-side Au plating layer on the surfaces of the main-face-side connection terminals and a first back-face-side Au plating layer on the surfaces of the back-face-side connection terminals; a masking step of covering the first main-face-side Au plating layer with a protection layer; a first back-face-side Au plating layer removal step of removing the first back-face-side Au plating layer after completing the masking step; a second Au plating step of forming a second back-face-side Au plating layer on the surfaces of the back-face-side connection terminals, from which the first back-face-side Au plating layer has been removed, to a thickness greater than that of the first main-face-side Au plating layer; and a protection layer removal step of removing the protection layer after completing the second Au plating step.

According to the present embodiment, after forming a first main-face-side Au plating layer and a first back-face-side Au plating layer in the first Au plating step, the first main-face-side Au plating layer is covered with a protection layer, and only the first back-face-side Au plating layer is removed. Subsequently, in the second Au plating step, a second back-face-side Au plating layer is formed to a thickness greater than that of the first main-face-side Au plating layer.

Therefore, in a printed-wiring substrate having main-face-side connection terminals for solder-bonding to connection terminals of an electronic component and back-face-side connection terminals for connecting, through mechanical contact, to connection terminals of another substrate, the Au plating layer of the main-face-side connection terminals (the first main-face-side Au plating layer) can be formed to have a relatively small thickness; and the Au plating layer of the back-face-side connection terminals (the second back-face-side Au plating layer) can be formed to have a relatively large thickness.

Such a printed-wiring substrate can enhance the solderability between the main-face-side connection terminals and the connection terminals of the electronic component, so that the connection reliability can be improved. In addition, the reliability of the connection between the back-face-side connection terminals and the connection terminals of another substrate can be improved.

Further, because the first back-face-side Au plating layer is removed before forming the thick second back-face-side Au plating layer, this prevents fabrication conditions from becoming unstable (e.g., where formation of an Au plating layer on the first back-face-side Au plating layer becomes difficult), which unstable conditions would otherwise result when the first back-face-side Au plating layer is exposed to atmospheric air or high temperature during the masking step. Therefore, the thick second back-face-side Au plating layer can be reliably formed in the second Au plating step.

Moreover, in the above-described method of fabricating a printed-wiring substrate, the first Au plating is preferably first displacement Au plating; and the second Au plating is preferably second displacement Au plating.

In the present embodiment, the first displacement Au plating and the second displacement Au plating are performed using an acidic or neutral plating solution, and thus the problem of dissolution of the protection layer with resultant variation in plating conditions is prevented. Further, in the case in which a printed-wiring substrate formed of resin is fabricated, the problems of solder resist layer damage by the plating solution and harrowing can be avoided.

Moreover, in the above-described method of fabricating a printed-wiring substrate, the second Au plating step preferably comprises a second thin displacement Au plating step of forming a second back-face-side thin Au plating layer on the surfaces of the back-face-side connection terminals, from which the first back-face-side Au plating layer has been removed; and a second thick displacement Au plating step of forming a second back-face-side thick Au plating layer on the second back-face-side thin Au plating layer.

In the present embodiment, a second back-face-side thin displacement Au plating layer is formed on the back-face-side connection terminals, from which the first back-face-side Au plating layer has been removed, and then a second back-face-side thick displacement Au plating layer is formed on the second back-face-side thin displacement Au plating layer.

When the Au plating layer is formed in two steps as described above, variation in thickness of the back-face-side Au plating layer (the second back-face-side thin displacement Au plating layer and the second back-face-side thick displacement Au plating layer) can be suppressed. Further, formation of the second back-face-side thin displacement Au plating layer shortens the plating time necessary for forming the second back-face-side thick displacement Au plating layer.

DESCRIPTION OF REFERENCE NUMERALS

Figure 1:
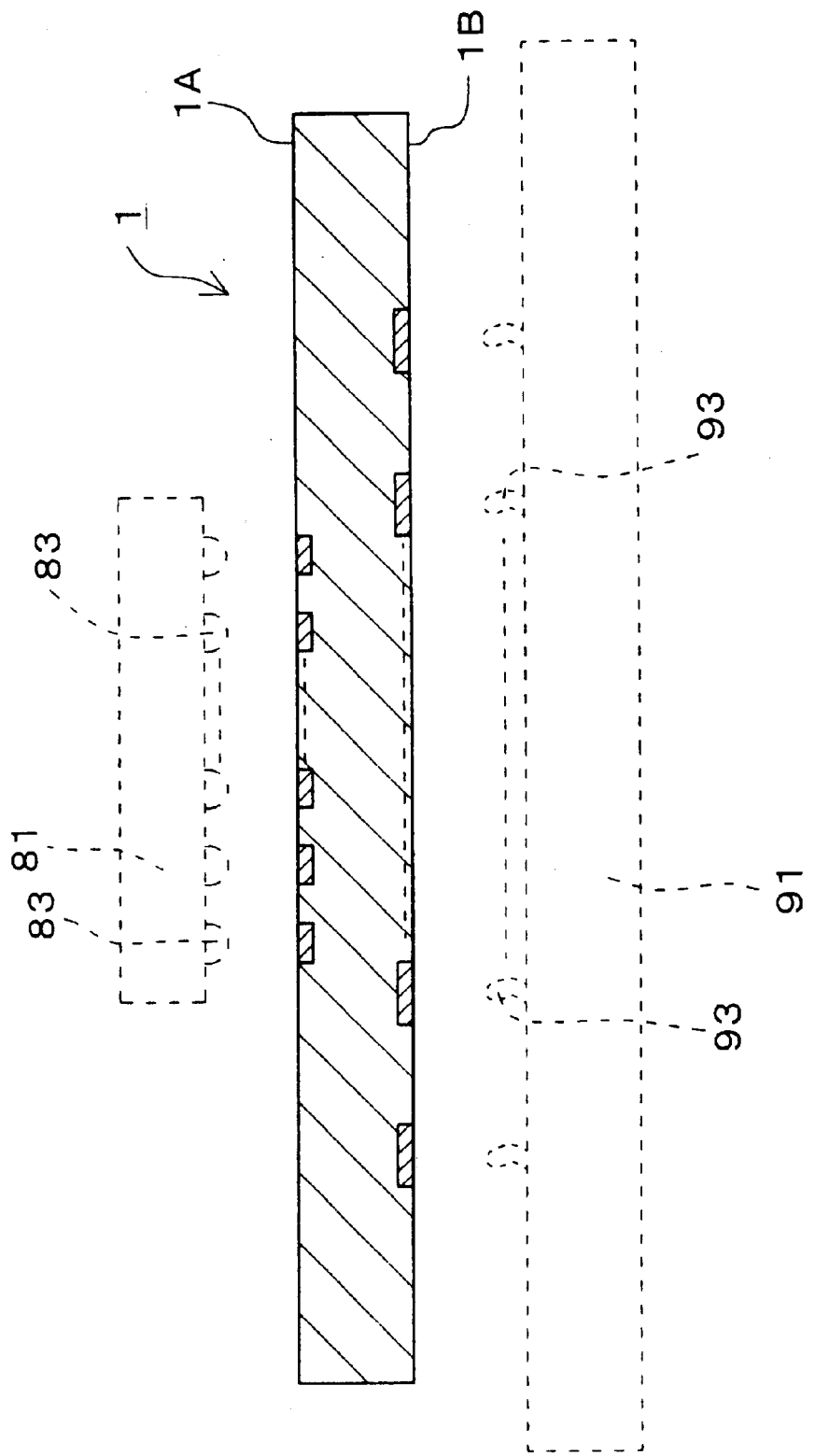
FIG. 1 is a sectional view of a printed-wiring substrate according to an embodiment of the present invention.

1: printed-wiring substrate
1A: main face
1B: back face
33: main-face-side connection terminal
41: back-face-side connection terminal
45: main-face-side displacement Au plating layer (first main-face-side displacement Au plating layer)

55: back-face-side displacement Au plating layer
62: first back-face-side displacement Au plating layer
56: second back-face-side thin displacement Au plating layer
57: second back-face-side thick displacement Au plating layer
67: protection layer
81: IC chip (electronic component)
91: motherboard (another substrate)

DETAILED DESCRIPTION OF THE PREFERRED EMBODIMENTS

An embodiment of the present invention will next be described with reference to the drawings. However, the present invention should not be construed as being limited thereto.

Figure 2:
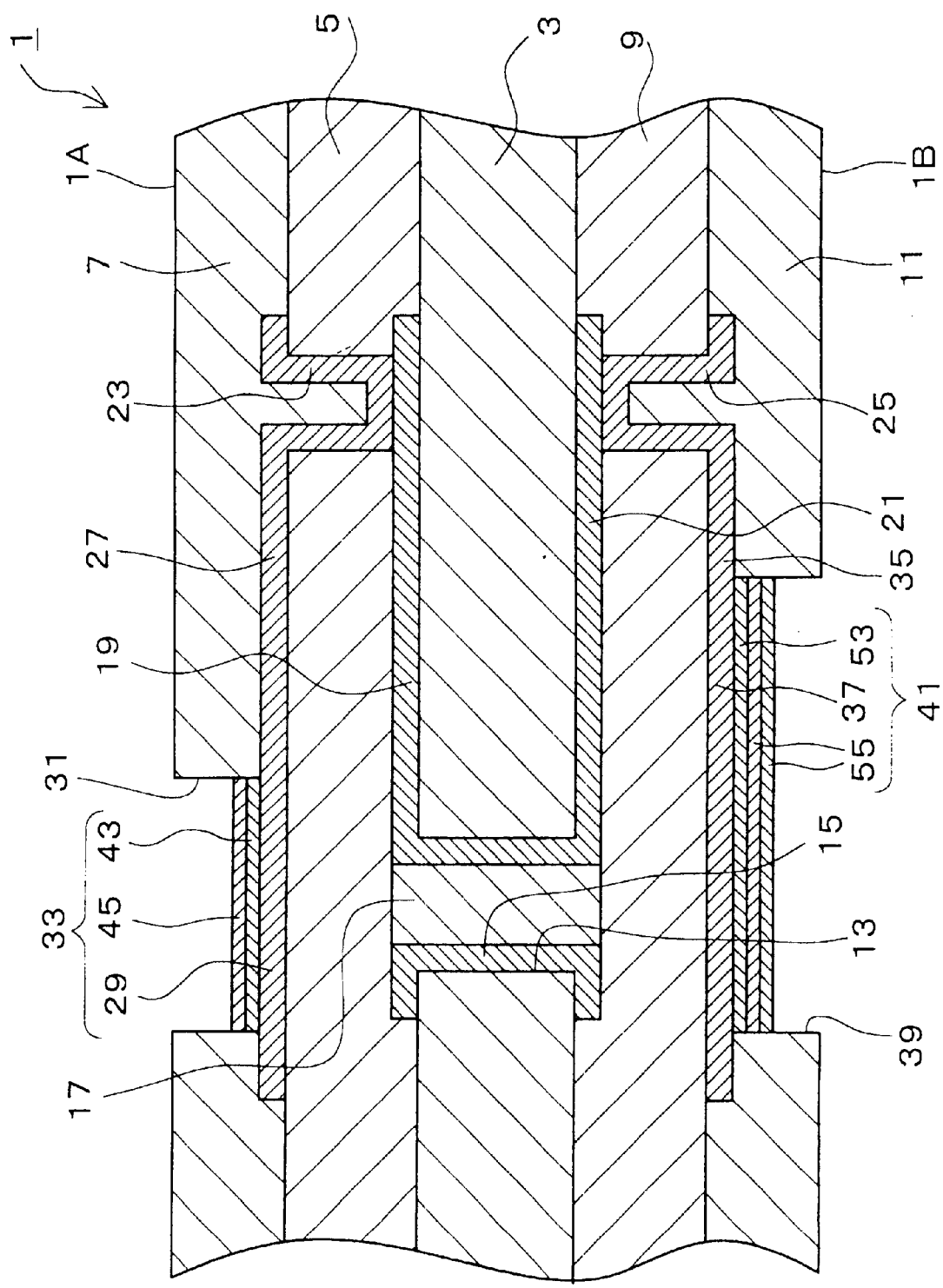
FIG. 2 is an enlarged partial sectional view of the printed-wiring substrate according to the embodiment.

FIGS. 1 and 2 show a printed-wiring substrate 1 according to the embodiment, wherein FIG. 1 shows a sectional view of the printed-wiring substrate 1, and FIG. 2 shows an enlarged partial sectional view of the printed-wiring substrate 1.

The printed-wiring substrate 1 includes a main face 1A and a back face 1B and assumes a substantially plate-like form. An IC chip (electronic component) 81, which is represented by a broken line in FIG. 1, can be solder-bonded to the main face 1A, whereas a motherboard (another substrate) 91, which is represented by a broken line in FIG. 1, can be connected, through mechanical contact, to the back face 1B by use of a socket.

As shown in FIG. 2, the printed-wiring substrate 1 has at its center a core substrate 3 assuming a substantially plate-like form. A main-face-side resin insulation layer 5 is formed on the main face 1A of the core substrate 3; and a main-face-side solder resist layer 7 is formed on the main-face-side resin insulation layer 5. Similarly, a back-face-side resin insulation layer 9 is formed on the back face 1B of the core substrate 3; and a back-face-side solder resist layer 11 is formed on the back-face-side resin insulation layer 9.

A large number of substantially cylindrical core through holes 13 are formed in the core substrate 3 to penetrate the core substrate 3. A substantially cylindrical through-hole conductor 15 is formed along the wall surface of each core through hole 13 and is filled with resin filler 17. A main-face-side first conductor layer 19, including pads and wiring for connection with the through-hole conductor 15, is formed between the core substrate 3 and the main-face-side resin insulation layer 5. Similarly, a back-face-side first conductor layer 21, including pads and wiring for connection with the through-hole conductor 15, is formed between the core substrate 3 and the back-face-side resin insulation layer 9.

A large number of main-face-side via conductors 23 are formed in the main-face-side resin insulation layer 5 so as to penetrate the layer 5 and establish connection with the main-face-side first conductor layer 19. Meanwhile, a large number of back-face-side via conductors 25 are formed in the back-face-side resin insulation layer 9 so as to penetrate the layer 9 and establish connection with the back-face-side first conductor layer 21.

A main-face-side second conductor layer 27, including pads and wiring for connection with the main-face-side via conductors 23, is formed between the main-face-side resin insulation layer 5 and the main-face-side solder resist layer 7. Main-face-side pads 29, which are portions of the layer 27, are exposed from main-face-side openings 31 penetrating the main-face-side solder resist layer 7.

Similarly, a back-face-side second conductor layer 35, including pads and wiring for connection with the back-face-side via conductors 25, is formed between the back-face-side resin insulation layer 9 and the back-face-side solder resist layer 11. Back-face-side pads 37, which are portions of the layer 35, are exposed from back-face-side openings 39 penetrating the back-face-side solder resist layer 11.

In order to prevent oxidation, a main-face-side Ni plating layer 43 having a thickness of about 6 $\mu$m is formed on each main-face-side pad 29; and, through displacement Au plating, a main-face-side displacement Au plating layer 45 is formed to a thickness of 0.03 to 0.12 $\mu$m (in the present embodiment, 0.05 $\mu$m) on the main-face-side Ni plating layer 43.

In the present embodiment, the main-face-side pad 29, the main-face-side Ni plating layer 43, and the main-face-side displacement Au plating layer 45 constitute a main-face-side connection terminal 33, which is to be solder-bonded to a corresponding connection terminal 83 of the IC chip 81 on the main face 1A side.

Meanwhile, similar to the case of the main-face-side connection terminal 33, a back-face-side Ni plating layer 53 having a thickness of about 6 $\mu$m is formed on each back-face-side pad 37; and, through displacement Au plating, a back-face-side displacement Au plating layer 55 is formed on the back-face-side Ni plating layer 53. The back-face-side displacement Au plating layer 55 is thicker than the main-face-side displacement Au plating layer 45 and has a thickness not less than 0.2 $\mu$m (in the present embodiment, 0.8 $\mu$m).

The back-face-side pad 37, the back-face-side Ni plating layer 53, and the back-face-side displacement Au plating layer 55 constitute a back-face-side connection terminal 41, which is to be connected, through mechanical contact, to a corresponding connection terminal 93 of the motherboard 91 on the back face 1B side.

In the printed-wiring substrate 1, the main-face-side displacement Au plating layer 45 is formed to have a thickness of not less than 0.03 $\mu$m but not greater than 0.12 $\mu$m; and the back-face-side displacement Au plating layer 55 is formed to have a thickness of not less than 0.2 $\mu$m.

Accordingly, only a small amount of inter-metallic compound is produced from Au of the main-face-side connection terminals 33 and Sn contained in solder when the main-face-side connection terminals 33 and the connection terminals 83 of the IC chip 81 are soldered together. Therefore, the solderability of the main-face-side connection terminals 33 is enhanced, so that the reliability of connection between the main-face-side connection terminals 33 and the connection terminals 83 of the IC chip 81 is improved. In addition, the problem of exfoliation of the back-face-side displacement Au plating layer 55 with resultant exposure of the back-face-side Ni plating layer 53 serving as a base layer and increased contact resistance, which problem would otherwise occur when the back-face-side connection terminals 41 are connected to the connection terminals 93 of the motherboard 91 through mechanical contact, can be avoided. Therefore, the reliability of connection between the back-face-side connection terminals 41 and the connection terminals 93 of the motherboard 91 can be improved as well.

Next, the method for fabricating the above-described printed-wiring substrate 1 will be described with reference to FIGS. 3 to 8.

Figure 3:
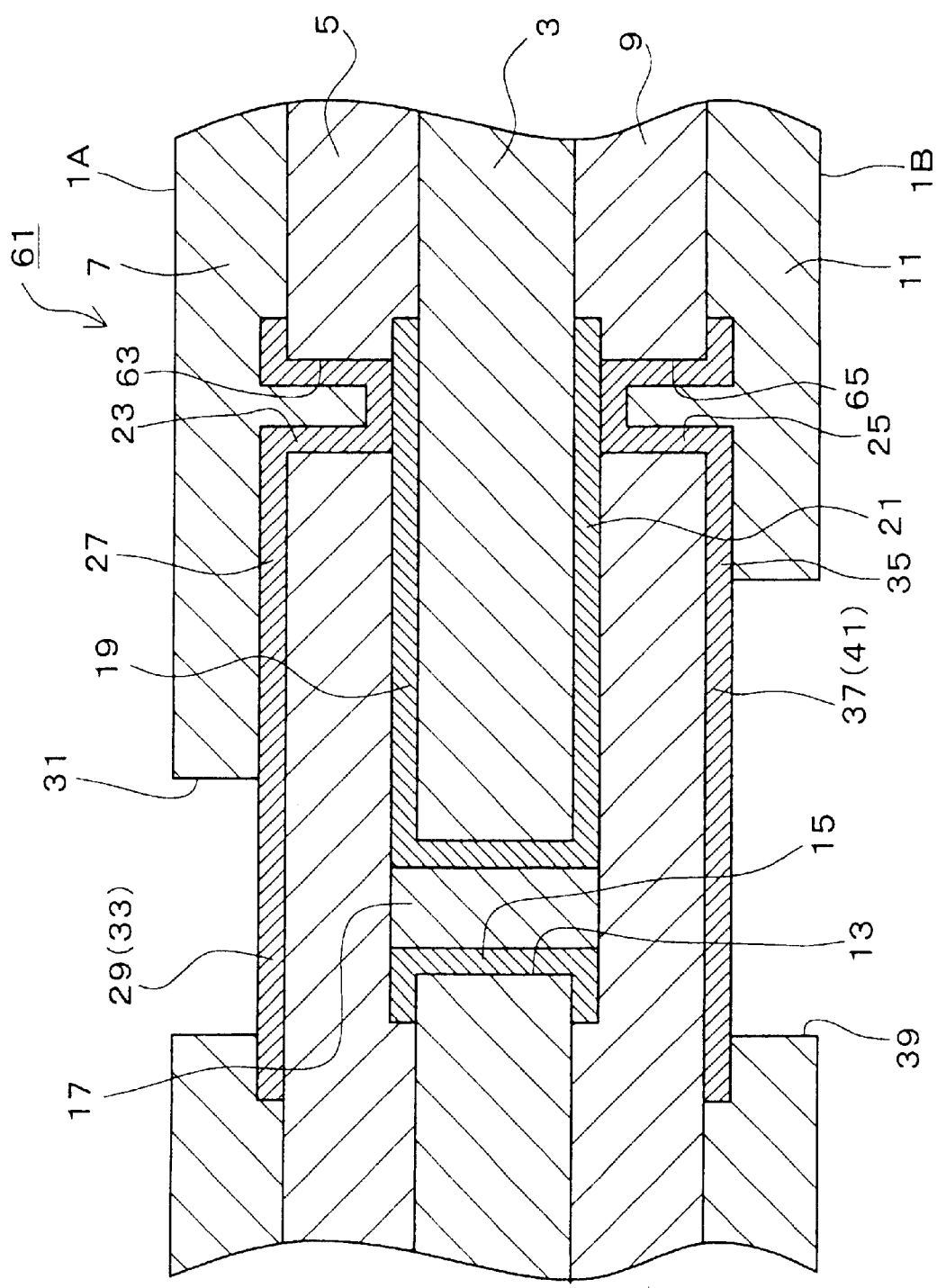
FIG. 3 is an explanatory view showing a method for fabricating the printed-wiring substrate according to the embodiment, in which a printed-wiring substrate having exposed main-face-side and back-face-side pads is shown.

First, according to a known method, a printed-wiring substrate 61 as shown in FIG. 3 is fabricated. The printed-wiring substrate 61 has a main face 1A and a back face 1B, and assumes a substantially plate-like form. Further, the printed-wiring substrate 61 has exposed main-face-side pads 29 and back-face-side pads 37.

Specifically, a core substrate 3 whose opposite faces are covered with copper foil is prepared; and a large number of core through holes 13 are formed at predetermined positions. Subsequently, electroless Cu plating and electrolytic Cu plating are performed successively in order to form a Cu plating layer on each of the copper foils on the opposite faces of the core substrate 3 and to form a through-hole conductor 15 on the wall surface of each of the core through holes 13. Subsequently, resin paste is charged into the through-hole conductor 15 through printing and is cured by applying heat, so that a resin filler 17 is formed. Subsequently, an etching resist layer of a predetermined pattern is formed on each of the Cu plating layers on the opposite faces; and portions of the Cu plating layers and copper foils exposed from the resist layers are removed by etching in order to form a main-face-side first conductor layer 19 of a predetermined pattern and a back-face-side first conductor layer 21 of a predetermined pattern.

Next, a semi-hardened resin insulation layer is formed on each of the opposite faces of the core substrate 3. The semi-hardened resin insulation layer is exposed using a mask having a predetermined pattern, and is then developed. Subsequently, the semi-hardened resin insulation layer is cured by applying heat, so as to form a main-face-side resin insulation layer 5 having main-face-side blind holes 63 used for formation of main-face-side via conductors 23 and a back-face-side resin insulation layer 9 having back-face-side blind holes 65 used for forming back-face-side via conductors 25.

Subsequently, electroless Cu plating and electrolytic Cu plating are performed successively in order to form a Cu plating layer on each of the main-face-side resin insulation layer 5 and the back-face-side resin insulation layer 9, to form a main-face-side via conductor 23 in each of the main-face-side blind holes 63, and to form a back-face-side via conductor 25 in each of the main-face-side blind holes 65. Subsequently, an etching resist layer of a predetermined pattern is formed on each of the Cu plating layers on the opposite faces; and portions of the Cu plating layers exposed from the resist layers are removed by etching in order to form a main-face-side second conductor layer 27 of a predetermined pattern and a back-face-side second conductor layer 35 of a predetermined pattern.

Next, a semi-hardened resin insulation layer is formed on each of the main-face-side resin insulation layer 5 and the back-face-side resin insulation layer 9. The semi-hardened resin insulation layer is exposed using a mask having a predetermined pattern, and is then developed. Subsequently, the semi-hardened resin insulation layer is cured by applying heat, to thereby form a main-face-side solder resist layer 7 having main-face-side openings 31 for exposing the main-face-side pads 29 and a back-face-side solder resist layer 11 having back-face-side openings 39 for exposing the back-face-side pads 37. Thus, the printed-wiring substrate 61 shown in FIG. 3 is completed.

Figure 4:
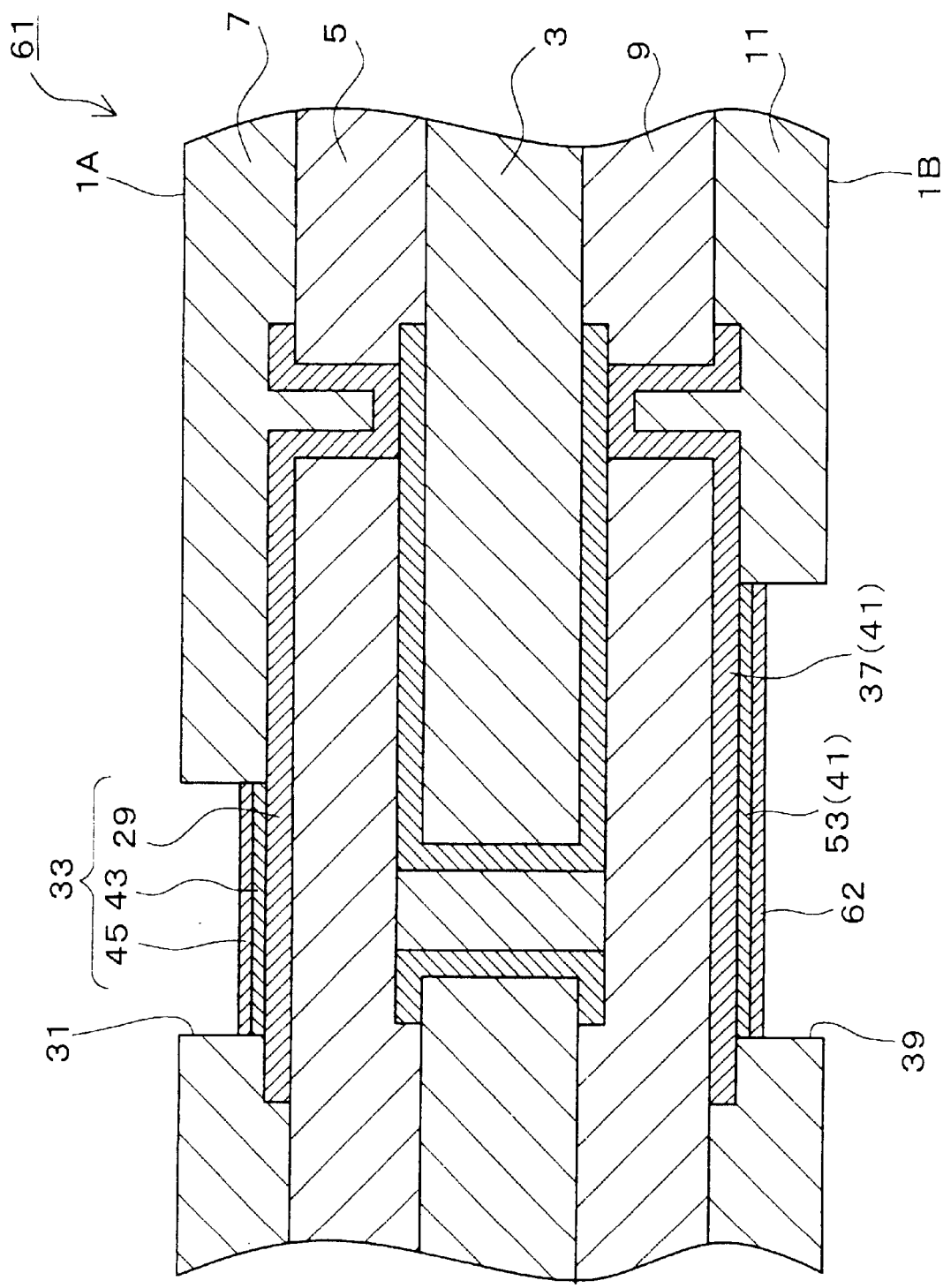
FIG. 4 is an explanatory view showing the method for fabricating the printed-wiring substrate according to the embodiment, showing a state after completion of a first displacement Au plating step.

In a subsequent Ni plating step, the printed-wiring substrate 61 undergoes Ni—P plating (NP-7000, product of EEJA) such that a main-face-side Ni plating layer 43 having a thickness of about 6 $\mu$m is formed on each of the main-face-side pads 29 exposed from the main-face-side openings 31, and a back-face-side Ni plating layer 53 having a thickness of about 6 $\mu$m is formed on each of the back-face-side pads 37 exposed from the back-face-side openings 39 (see FIG. 4).

In a subsequent first displacement Au plating step, as shown in FIG. 4, first displacement Au plating (Lectroless Au1200, product of EEJA) is performed such that a first main-face-side displacement Au plating layer 45 (main-face-side displacement Au plating layer 45) having a thickness of 0.05 $\mu$m is formed on the main-face-side Ni plating layer 43 of each main-face-side connection terminal 33, and a first back-face-side displacement Au plating layer 62 having a thickness of 0.05 $\mu$m is formed on the back-face-side Ni plating layer 53 of each back-face-side connection terminal 41.

Because the first displacement Au plating is performed using a plating solution of weak acid (pH=about 5), this prevents the main-face-side solder resist layer 7 and the back-face-side solder resist layer 11 from dissolving into the plating solution. Further, it is possible to prevent harrowing, which would otherwise occur due to penetration of the plating solution under the main-face-side solder resist layer 7 and the back-face-side solder resist layer 11.

Figure 5:
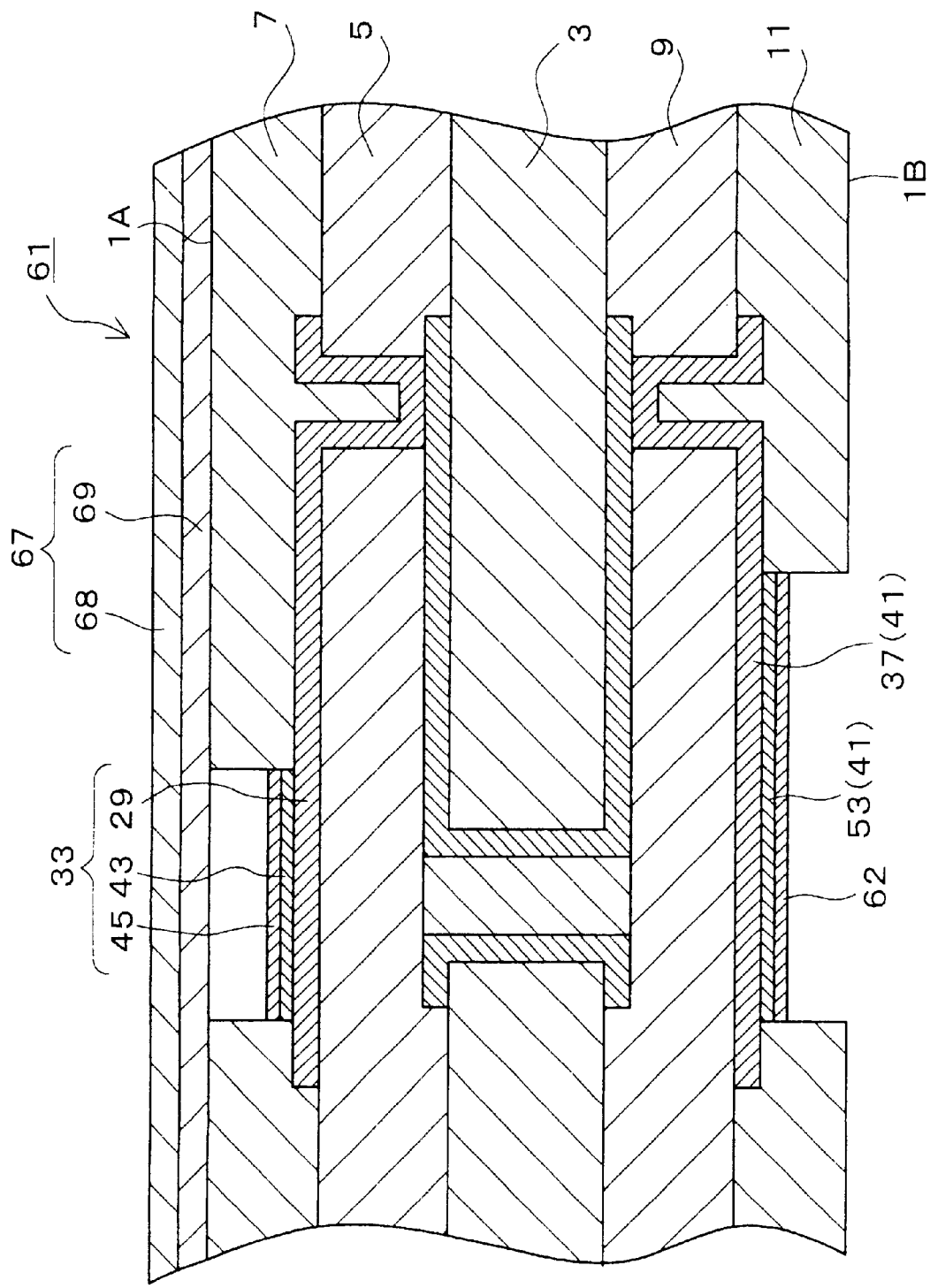
FIG. 5 is an explanatory view showing the method for fabricating the printed-wiring substrate according to the embodiment, showing a state after completion of a masking step.

In a subsequent masking step, as shown in FIG. 5, a protection layer 67 is bonded to the main face 1A of the printed-wiring substrate 61 in order to cover the entirety of the main-face-side displacement Au plating layer 45. The protection layer 67 consists of a protection film 68 and an adhesion prevention film 69 for preventing the adhesive of the protection film 68 from adhering to the main-face-side connection terminals 33 and the like.

Although not shown, the protection film 67 is fixed in such a manner that the protection film 68 adheres to the circumferential edge portion of the printed-wiring substrate 61. Since the protection film 68 is exposed at the circumferential edge portion of the adhesion prevention film 69 to surround the main-face-side connection terminals 33, the protection film 68 can protect the main-face-side displacement Au plating layer 45 while preventing the adhesive of the protection film 68 from adhering to the main-face-side connection terminals 33.

Figure 6:
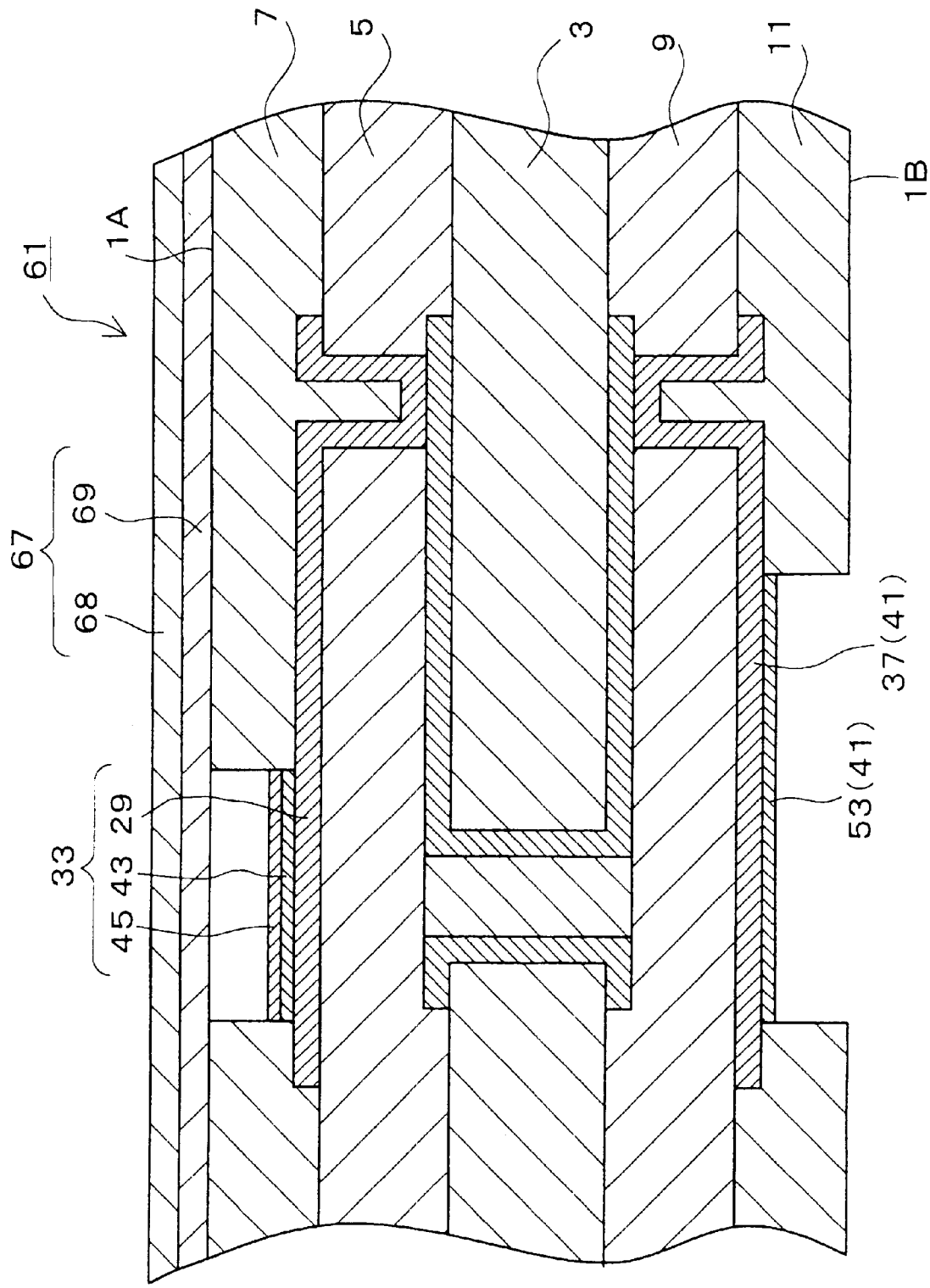
FIG. 6 is an explanatory view showing the method for fabricating the printed-wiring substrate according to the embodiment, showing a state after completion of a first back-face-side Au plating layer removal step.

Subsequently, in a first back-face-side Au plating layer removal step, as shown in FIG. 6, the printed-wiring substrate 61 is processed using an Au removing agent (GS-N Salt, product of EEJA) to thereby remove the first back-face-side displacement Au plating layer 62, so that the back-face-side Ni plating layer 53 serving as a base layer is exposed. At this time, the main-face-side displacement Au plating layer 45 is not removed by etching, because the main-face-side displacement Au plating layer 45 is covered with the protection layer 67.

As described above, in the present invention, the first back-face-side displacement Au plating layer 62 is removed before forming a back-face-side displacement Au plating layer 55, which will be described below. Therefore, this prevents fabrication conditions from becoming unstable (e.g., where formation of an Au plating layer on the first back-face-side displacement Au plating layer becomes difficult), which unstable conditions would otherwise result when the first back-face-side displacement Au plating layer 62 is exposed to atmospheric air or high temperature during the masking step. Accordingly, the back-face-side displacement Au plating layer 55 can be formed to a large thickness in a subsequent step, which will be described below.

Figure 7:
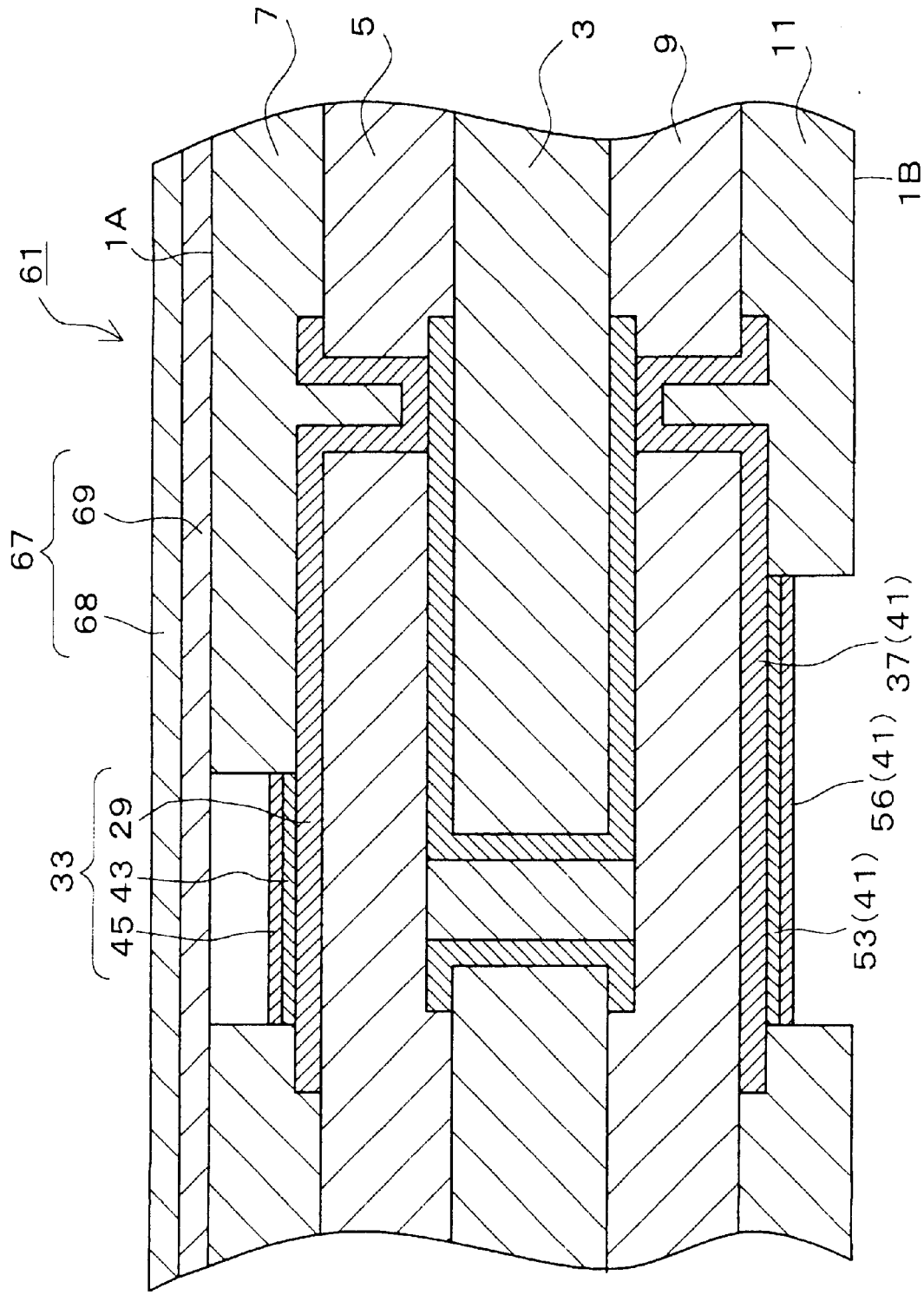
FIG. 7 is an explanatory view showing the method for fabricating the printed-wiring substrate according to the embodiment, showing a state after completion of a second thin displacement Au plating step.

Next, in a second thin displacement Au plating step, which is a first substep of a second displacement Au plating step, as shown in FIG. 7, the printed-wiring substrate 61 is subjected to second thin displacement Au plating (Lectroless ST, product of EEJA) such that a second back-face-side thin displacement Au plating layer 56 having a thickness of about 0.1 μm is formed on the back-face-side Ni plating layer 53 of the back-face-side connection terminal 41.

Since the second thin displacement Au plating is performed using a neutral plating solution (pH=about 7), this prevents the protection layer 67 and the back-face-side solder resist layer 11 from dissolving into the plating solution. Further, it is possible to prevent harrowing, which would otherwise occur due to penetration of the plating solution under the back-face-side solder resist layer 11.

Figure 8:
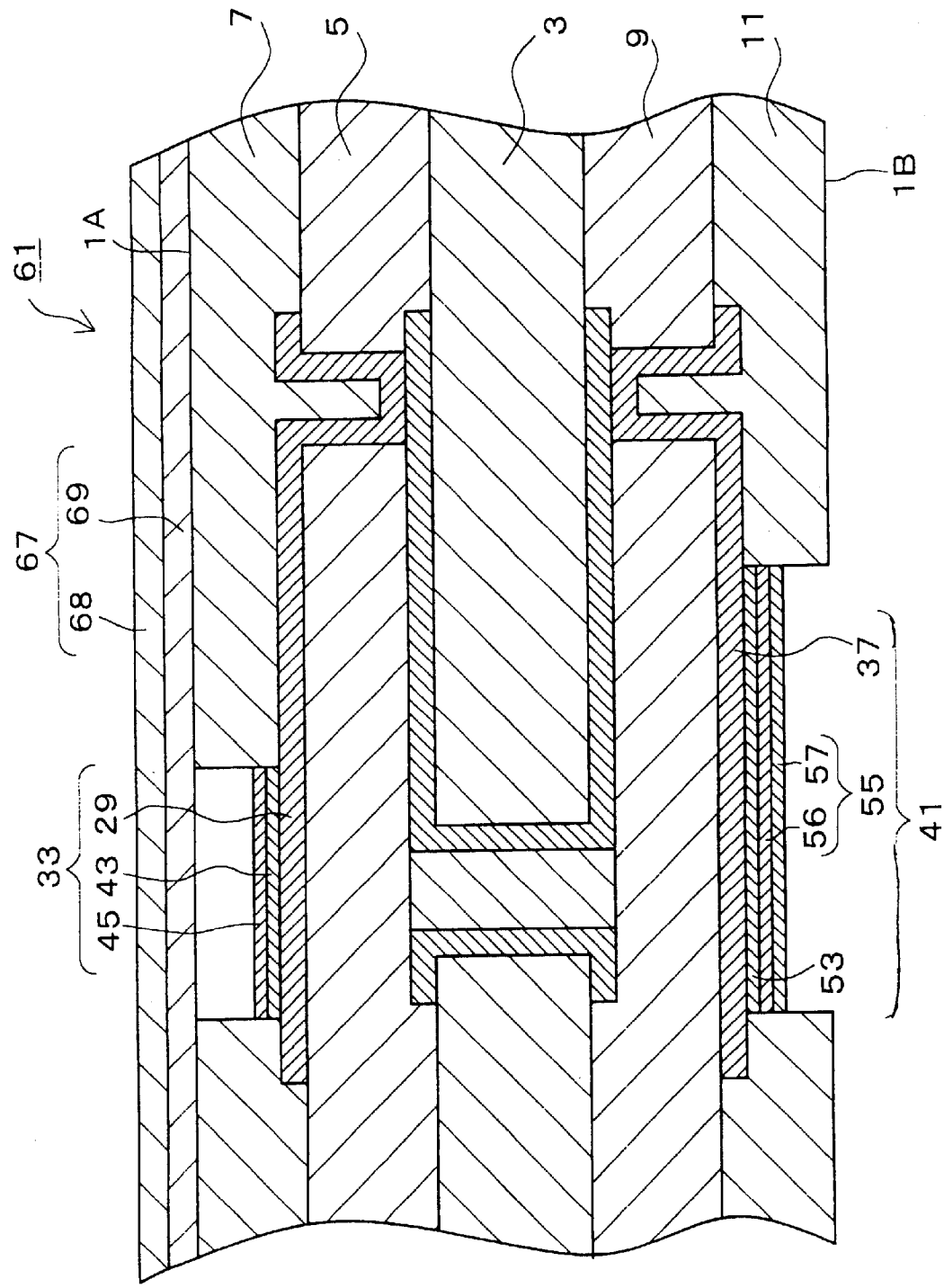
FIG. 8 is an explanatory view showing the method for fabricating the printed-wiring substrate according to the embodiment, showing a state after completion of a second thick displacement Au plating step.

Subsequently, in a second thick displacement Au plating step, which is a second substep of the second displacement Au plating step, as shown in FIG. 8, the printed-wiring substrate 61 is subjected to second thick displacement Au plating (Lectroless MT, product of EEJA) such that a second back-face-side thick displacement Au plating layer 57 is formed on the second back-face-side thin displacement Au plating layer 56 of the back-face-side connection terminal 41. The second back-face-side thick displacement Au plating layer 57 is thicker than the second back-face-side thin displacement Au plating layer 56 and has a thickness of about 0.7 μm. Thus, the back-face-side displacement Au plating layer 55 (thickness: about 0.8 μm) consisting of the second back-face-side thin displacement Au plating layer 56 and the second back-face-side thick displacement Au plating layer 57 is formed.

Since the second thick displacement Au plating is performed using a plating solution of weak acid (pH=about 5.5), this prevents the protection layer 67 and the back-face-side solder resist layer 11 from dissolving into the plating solution. Further, it is possible to prevent harrowing, which would otherwise occur due to penetration of the plating solution under the back-face-side solder resist layer 11.

As described above, in the present embodiment, the second back-face-side thin displacement Au plating layer 56 is first formed, and then the second back-face-side thick displacement Au plating layer 57 is formed. Therefore, variation in thickness of the back-face-side displacement Au plating layer 55 can be suppressed. Further, the plating time necessary forming of the second thick displacement Au plating layer can be shortened.

In a subsequent protection layer removal step, an operator peels the protection layer 67 from the main face 1A of the printed-wiring substrate 61 with his or her fingers. Although not illustrated, the protection layer 67 is bonded to the printed-wiring substrate 61 in such a manner that a portion of the protection layer 67 projects from the printed-wiring substrate 61. In this case, removal of the protection layer 67 is facilitated.

Thus, the printed-wiring substrate 1 shown in FIGS. 1 and 2 is completed.

When the above-described fabrication method is used to form the printed-wiring substrate 1 having the main-face-side connection terminals 33 to be solder-bonded to the connection terminals 83 of the IC chip 81 and the back-face-side connection terminals 41 to be connected, through mechanical contact, to the connection terminals 93 of the motherboard 91, the main-face-side displacement Au plating layer 45 (the first main-face-side displacement Au plating layer 45) of each main-face-side connection terminal 33 can be rendered relatively thin, and the back-face-side displacement Au plating layer 55 (the second back-face-side thin displacement Au plating layer 56 and the second back-face-side thick displacement Au plating layer 57) of each back-face-side connection terminal 41 can be rendered relatively thick.

Accordingly, the solderability between the main-face-side connection terminals 33 and the connection terminals 83 of the IC chip 81 is enhanced, so that the reliability of the connection can be improved. Further, the reliability of the connection between the back-face-side connection terminals 41 and the connection terminals 93 of the motherboard 91 can be improved.

First Modification

Next, a first modification of the above-described embodiment will be described with reference to FIG. 9. A printed-wiring substrate according to the present modification has the same configuration as that of the printed-wiring substrate 1 according to the above-described embodiment, but differs therefrom in formation of the back-face-side displacement Au plating layer 55.

For fabrication of the printed-wiring substrate 1, similar to the above-described embodiment, a printed-wiring substrate 61 as shown in FIG. 3 is fabricated. The printed-wiring substrate 61 has a main face 1A and a back face 1B, and assumes a substantially plate-like form. Further, the printed-wiring substrate 61 has exposed main-face-side pads 29 and back-face-side pads 37. Subsequently, an Ni plating step, a first displacement Au plating step, a masking step, and a first back-face-side Au plating layer removal step are performed successively.

Figure 9:
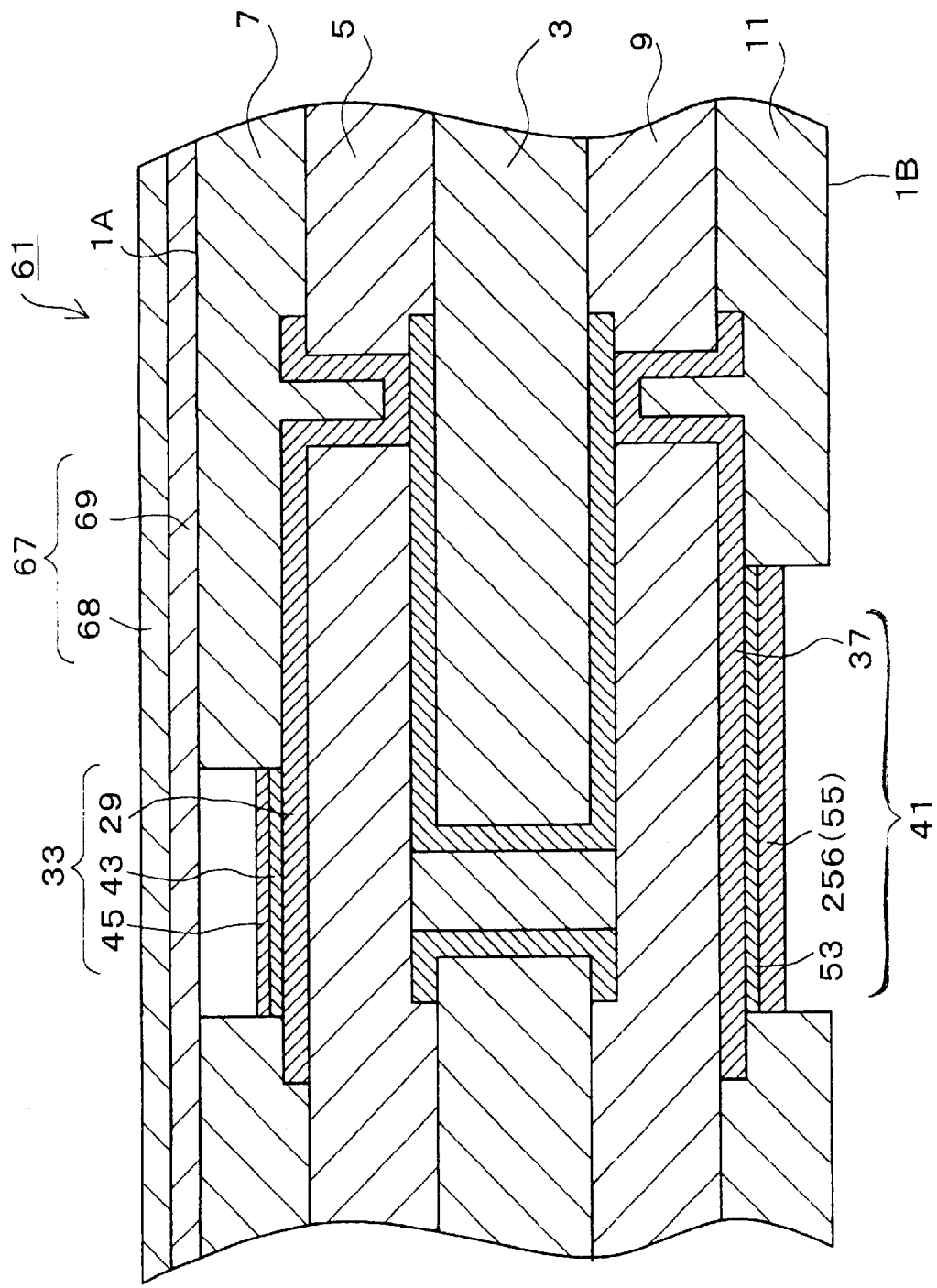
FIG. 9 is an explanatory view showing the method for fabricating the printed-wiring substrate according to a first modification, showing a state after completion of a second displacement Au plating step.

In the present modification, in a subsequent second displacement Au plating step, as shown in FIG. 9, the printed-wiring substrate 61 is subjected to second thick displacement Au plating (Lectroless MT, product of EEJA) such that a second back-face-side thick displacement Au plating layer 256 having a thickness of about 0.8 μm is formed on the back-face-side Ni plating layer 53 of the back-face-side connection terminal 41, to thereby form the back-face-side displacement Au plating layer 55. That is, in contrast to the above-described embodiment in which the displacement Au plating is performed in two stages in order to form the back-face-side displacement Au plating layer 55, in the present modification, the displacement Au plating is performed in a single stage in order to form the back-face-side displacement Au plating layer 55. Accordingly, the process is simplified as compared with the fabrication method employed in the above-described embodiment.

In this case as well, because the second thick displacement Au plating is performed using a plating solution of a weak acid (pH=about 5.5), this prevents the protection layer 67 and the back-face-side solder resist layer 11 from dissolving into the plating solution. Further, it is possible to prevent harrowing, which would otherwise occur due to penetration of the plating solution under the back-face-side solder resist layer 11.

After completing the second displacement Au plating step, as in the above described embodiment, the protection layer 67 is removed from the main face 1A of the printed-wiring substrate 61 in the protection layer removal step, to thereby complete the printed-wiring substrate.

Even when the above-described fabrication method is used to form the printed-wiring substrate 1 having the main-face-side connection terminals 33 to be solder-bonded to the connection terminals 83 of the IC chip 81 and the back-face-side connection terminals 41 to be connected, through mechanical contact, to the connection terminals 93 of the motherboard 91, the main-face-side displacement Au plating layer 45 of each main-face-side connection terminal 33 can be rendered relatively thin, and the back-face-side displacement Au plating layer 55 of each back-face-side connection terminal 41 can be rendered relatively thick.

Accordingly, the solderability between the main-face-side connection terminals 33 and the connection terminals 83 of the IC chip 81 is enhanced, so that the reliability of the connection can be improved. Further, the reliability of the connection between the back-face-side connection terminals 41 and the connection terminals 93 of the motherboard 91 can be improved.

Second Modification

Next, a second modification of the above-described embodiment will be described with reference to FIG. 10. A printed-wiring substrate according to the present modification has the same configuration as that of the printed-wiring substrate 1 according to the above-described embodiment, but differs therefrom in formation of the back-face-side displacement Au plating layer 55.

According to the fabrication method of the present modification, formation of the printed-wiring substrate 61 shown in FIG. 3, a Ni plating step, a first displacement Au plating step, and a masking step are performed in the same manner as in the above-described embodiment. However, without carrying out a first back-face-side Au plating layer removal step, a second displacement Au plating step is performed after a masking step. Accordingly, a second back-face-side displacement Au plating layer 356 is formed on the first back-face-side displacement Au plating layer 62, which is left unremoved, so that the printed-wiring substrate can be fabricated with higher productivity.

Figure 10:
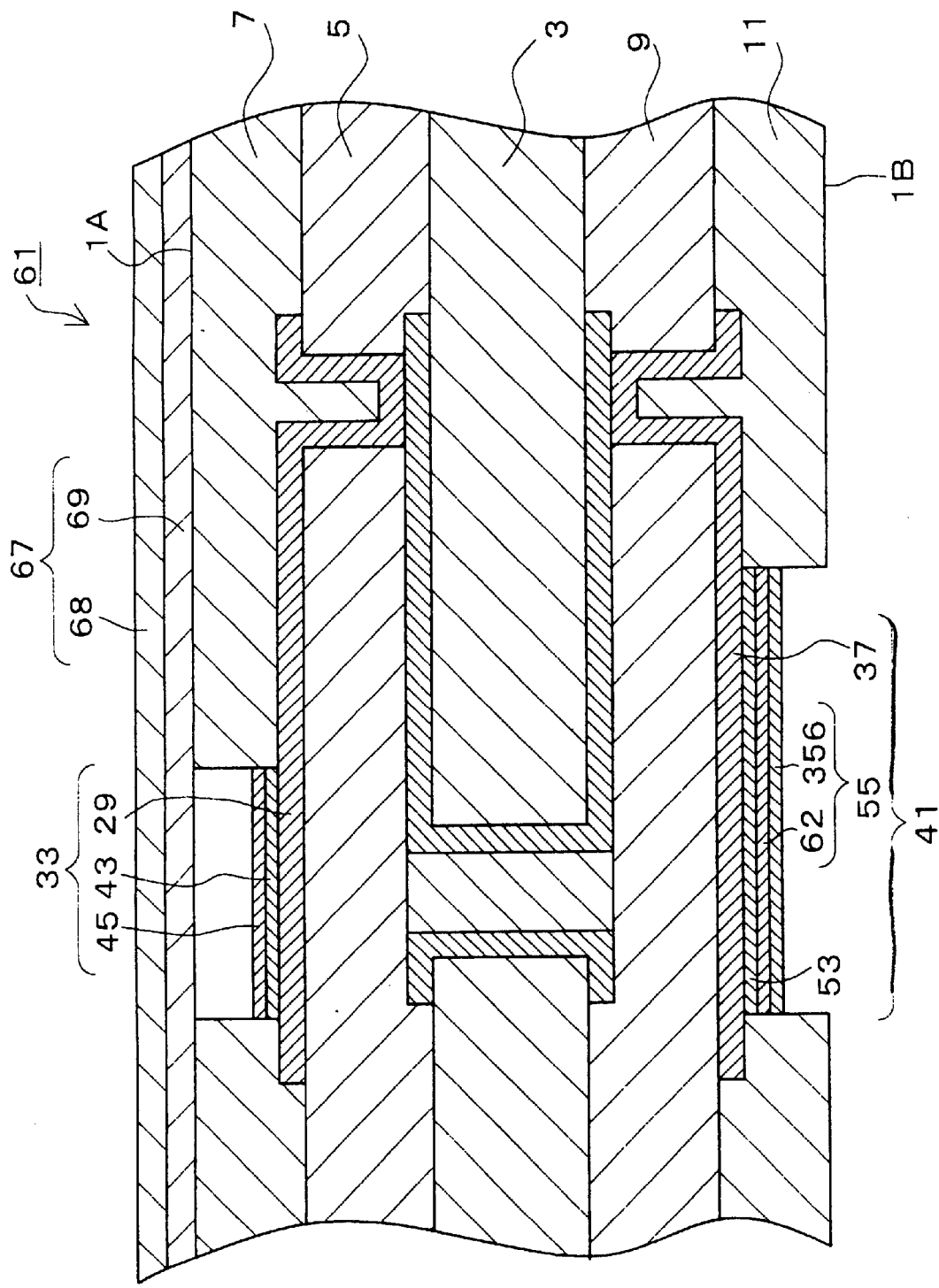
FIG. 10 is an explanatory view showing the method for fabricating the printed-wiring substrate according to a second modification, showing a state after completion of a second displacement Au plating step.
Figure 11:
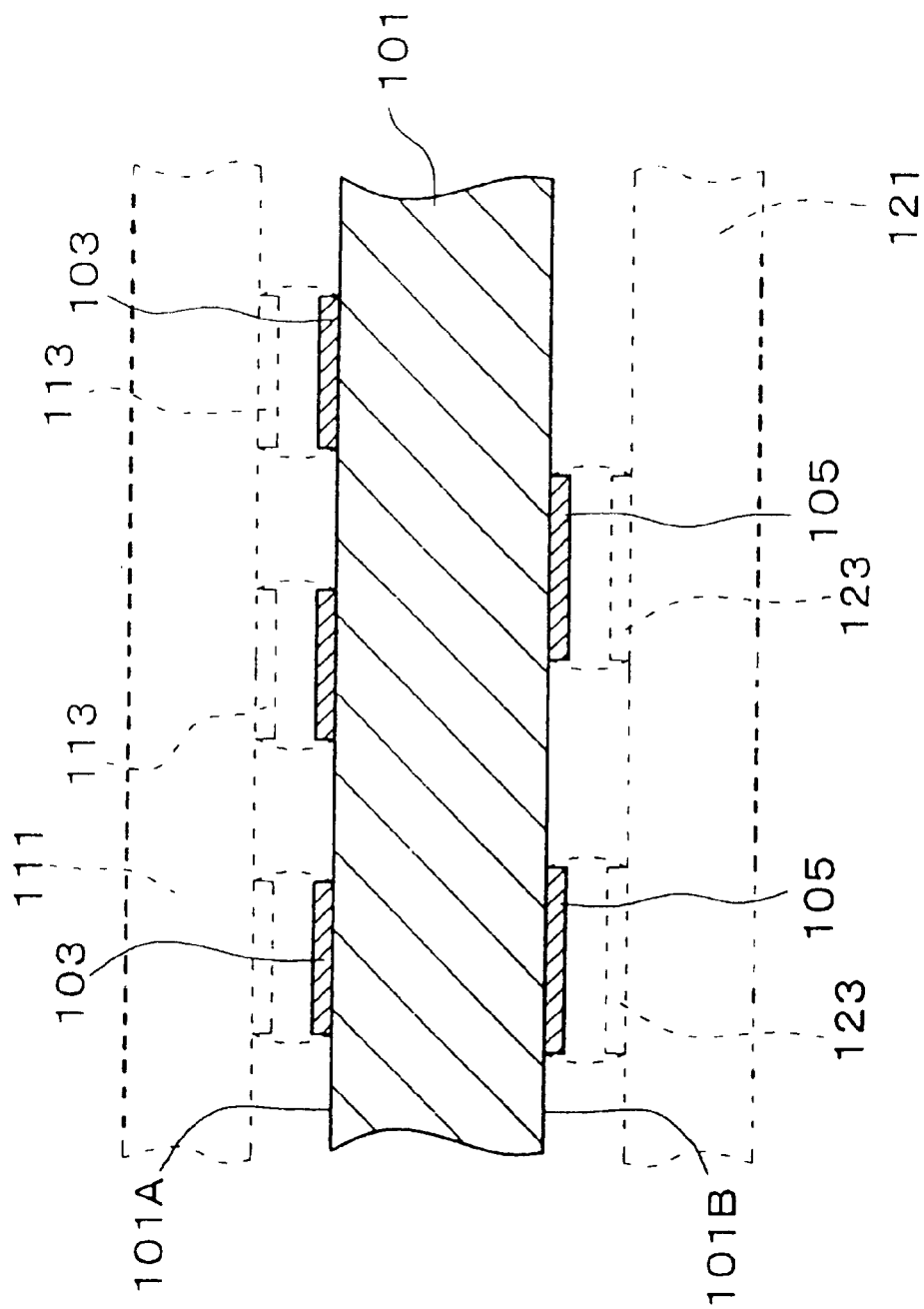
FIG. 11 is an enlarged partial sectional view of a conventional printed-wiring substrate.
Figure 12:
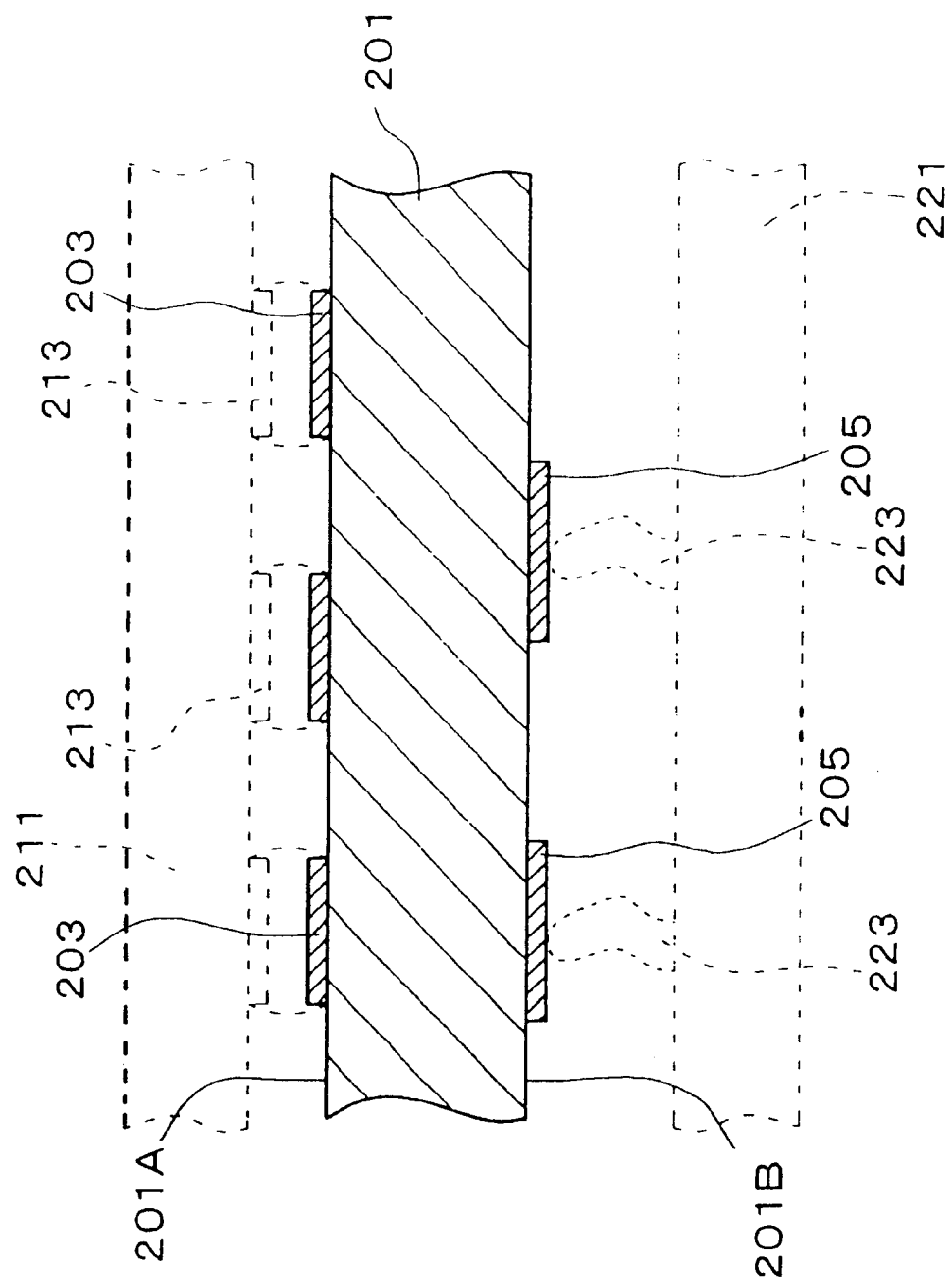
FIG. 12 is an enlarged partial sectional view of another conventional printed-wiring substrate.

In the second displacement Au plating step, as shown in FIG. 10, the printed-wiring substrate 61 is subjected to second thick displacement Au plating (Lectroless MT, product of EEJA) such that a second back-face-side displacement Au plating layer 356 having a thickness of about 0.4 μm is formed on the first back-face-side displacement Au plating layer 62.

In this case as well, since the second displacement Au plating is performed using a plating solution of a weak acid (pH=about 5.5), this prevents the protection layer 67 and the back-face-side solder resist layer 11 from dissolving into the plating solution. Further, harrowing can be prevented.

Even when the above-described fabrication method is used to form the printed-wiring substrate 1 having the main-face-side connection terminals 33 to be solder-bonded to the connection terminals 83 of the IC chip 81 and the back-face-side connection terminals 41 to be connected, through mechanical contact, to the connection terminals 93 of the motherboard 91, the main-face-side displacement Au plating layer 45 of each main-face-side connection terminal 33 can be rendered relatively thin, and the back-face-side displacement Au plating layer 55 (the first back-face-side displacement Au plating layer 62 and the second back-face-side displacement Au plating layer 356) of each back-face-side connection terminal 41 can be rendered relatively thick.

Accordingly, the solderability between the main-face-side connection terminals 33 and the connection terminals 83 of the IC chip 81 is enhanced, so that the reliability of the connection can be improved. Further, the reliability of the connection between the back-face-side connection terminals 41 and the connection terminals 93 of the motherboard 91 can be improved.

Although the present invention has been described with reference to the above embodiment, the present invention is not limited to the embodiment and first and second modifications thereof. The present invention can be modified freely without departing from the scope of the present invention.

For example, in the above-described embodiment and modifications, a printed-wiring substrate 1 formed of resin was described. However, the present invention can be applied to printed-wiring substrates formed of ceramic.

In the above-described embodiment and modifications, a fabrication method in which a masking step is performed after a first displacement Au plating step was described. However, the above described printed-wiring substrate can be fabricated by a method in which the masking is performed between a Ni plating step and a first displacement Au plating step.

For example, after completing a Ni plating step, a protection layer is formed to cover substantially the entirety of the back face 1B of the printed-wiring substrate 61, and then first displacement Au plating is performed to form a main-face-side displacement Au plating layer 45 only. Subsequently, the protection layer is removed, and a protection layer is formed to cover substantially the entirety of the main face 1A of the printed-wiring substrate 61. Subsequently, in a second displacement Au plating step, a back-face-side displacement Au plating layer 55 is formed. Subsequently, the protection layer is removed so as to complete the printed-wiring substrate 1.

In the above-described fabrication method, the first back-face-side displacement Au plating layer 62 is not formed. Therefore, a first back-face-side Au plating layer removal step becomes unnecessary, although the masking step must be performed twice.

This application is based on Japanese Patent Application No. 2000-156050 filed May 26, 2000, the disclosure of which is incorporated herein by reference in its entirety.

What is claimed is:

1. A component board including a printed-wiring substrate having a substantially plate-like shape, a main face and a back face, said printed-wiring substrate comprising:

main-face-side connection terminals solder-bonded to connection terminals of an electronic component which is mounted on the main face; and back-face-side connection terminals connected, through mechanical contact, to connection terminals of another substrate which is connected to the printed-wiring substrate on the back-face side thereof, wherein the surfaces of the main-face-side connection terminals are coated with a main-face-side Au plating layer; and the surfaces of the back-face-side connection terminals are coated with a back-face-side Au plating layer which is thicker than the main-face-side Au plating layer.

2. The component board including a printed-wiring substrate according to claim 1, wherein the main-face-side Au plating layer has a thickness of not less than 0.03 μm but not greater than 0.12 μm; and the back-face-side Au plating layer has a thickness of not less than 0.2 μm.

3. The component board including a printed-wiring substrate according to claim 1, wherein said back-face-side connection terminals are connected to connection terminals of another substrate via a socket.

* * * * *